United States Patent
Takagi

(10) Patent No.: US 9,476,905 B2
(45) Date of Patent: Oct. 25, 2016

(54) SENSOR ELEMENT, ELECTRONIC APPARATUS AND MOVING OBJECT

(71) Applicant: Seiko Epson Corporation, Tokyo (JP)

(72) Inventor: Shigekazu Takagi, Shiojiri (JP)

(73) Assignee: Seiko Epson Corporation (JP)

( * ) Notice: Subject to any disclaimer, the term of this patent is extended or adjusted under 35 U.S.C. 154(b) by 204 days.

(21) Appl. No.: 14/267,331

(22) Filed: May 1, 2014

(65) Prior Publication Data

US 2014/0338451 A1    Nov. 20, 2014

(30) Foreign Application Priority Data

May 16, 2013  (JP) .................................. 2013-103789

(51) Int. Cl.
*G01P 15/125* (2006.01)
*B81B 3/00* (2006.01)
*G01P 15/08* (2006.01)

(52) U.S. Cl.
CPC ........... *G01P 15/125* (2013.01); *B81B 3/0008* (2013.01); *B81B 2201/0235* (2013.01); *G01P 2015/0831* (2013.01); *G01P 2015/0871* (2013.01)

(58) Field of Classification Search
CPC ..................... G01P 15/125; G01P 2015/0871; B81B 2201/0235
USPC ...................................................... 73/514.32
See application file for complete search history.

(56) References Cited

U.S. PATENT DOCUMENTS

| | | | |
|---|---|---|---|
| 5,421,213 A | 6/1995 | Okada | |
| 5,581,035 A * | 12/1996 | Greiff | G01P 15/0802 324/688 |
| 5,987,989 A | 11/1999 | Yamamoto et al. | |
| 6,938,485 B2 * | 9/2005 | Kuisma | B81B 3/0013 361/280 |
| 7,721,604 B2 * | 5/2010 | Pruetz | G01P 15/125 73/514.32 |
| 8,079,262 B2 * | 12/2011 | Guo | G01P 15/0802 73/514.32 |
| 8,176,782 B2 | 5/2012 | Furukubo et al. | |
| 2012/0111615 A1 | 5/2012 | Yoda et al. | |
| 2013/0042684 A1 | 2/2013 | Yoda | |

FOREIGN PATENT DOCUMENTS

| | | |
|---|---|---|
| JP | 11-101697 | 4/1999 |
| JP | 2002-148278 A | 5/2002 |
| JP | 2007-298410 A | 11/2007 |
| JP | 2012-098208 A | 5/2012 |
| JP | 2013-040856 A | 2/2013 |
| JP | 2013-104868 A | 5/2013 |
| JP | 2013-160554 A | 8/2013 |

* cited by examiner

*Primary Examiner* — John Chapman, Jr.
(74) *Attorney, Agent, or Firm* — Harness, Dickey & Pierce, P.L.C.

(57) ABSTRACT

A sensor element includes: a detection electrode section; a movable body that is provided to face the detection electrode section; and a protruding section that is provided in a region where the detection electrode section is provided in a plan view of the detection electrode section seen in a vertical direction and protrudes toward the movable body. At least a part of a surface of the protruding section is made of an insulating material.

16 Claims, 8 Drawing Sheets

SENSOR ELEMENT, ELECTRONIC APPARATUS AND MOVING OBJECT

BACKGROUND

1. Technical Field

The present invention relates to a sensor element, an electronic apparatus, and a moving object.

2. Related Art

In the related art, as a sensor element that detects a physical quantity such as acceleration, a sensor element including a movable body that is a movable electrode supported by a support section to be capable of oscillating and a detection electrode section that is a fixed electrode section disposed at a position that faces the movable body has been proposed. In such a sensor element, as the movable body oscillates according to a force applied to the sensor element, a distance between the movable body and the detection electrode section is changed. The detection of acceleration or the like applied to the sensor element is performed based on change in an electrostatic capacitance generated between both the electrode sections due to the distance change. For example, Japanese Patent No. 4605087 discloses an electrostatic capacitance type sensor element including a movable electrode and a fixed electrode that is provided on an insulating layer to be separated from the movable electrode with an interval.

However, if the insulating layer on which the fixed electrode is provided is charged, there is a concern that the movable electrode is pulled toward the fixed electrode due to an electrostatic attraction (pulling force) generated by the charging. If the movable electrode is pulled toward the fixed electrode and comes into contact with the fixed electrode, loss (short circuit) of an electrostatic capacitance generated between both the electrodes occurs, which influences the detection of acceleration or the like.

SUMMARY

An advantage of some aspects of the invention is to solve at least a part of the problems described above, and the invention can be implemented as the following forms or application examples.

Application Example 1

This application example is directed to a sensor element including: a detection electrode section; a movable body that is provided to face the detection electrode section; and a protruding section that is provided in a region where the detection electrode section is provided in a plan view of the detection electrode section seen in a vertical direction, and protrudes toward the movable body, in which at least apart of a surface of the protruding section includes an insulating material.

According to the sensor element having this configuration, the detection electrode section and the movable body that faces the detection electrode section are provided. Further, the protruding section of which at least a part of the surface includes the insulating material is provided to protrude from the region where the detection electrode section is provided toward the movable body.

The movable body may be displaced by acceleration or the like applied to the sensor element. As the detection electrode section and the movable body are provided to face each other, an electrostatic capacitance is generated therebetween. The electrostatic capacitance is changed according to change in an interval between the detection electrode section and the movable body due to the acceleration or the like applied to the sensor element.

The sensor element may detect the acceleration or the like applied thereto based on the change in the electrostatic capacitance.

If the movable body is excessively displaced, the movable body comes into contact with the protruding section. Here, since the movable body comes into contact with the protruding section of which at least a part of the surface is made of the insulating material, it is possible to suppress contact of the movable body and the detection electrode section and a short circuit due to the contact, and to suppress the loss of the electrostatic capacitance generated between the movable body and the detection electrode section.

Accordingly, it is possible to obtain a sensor element capable of suppressing contact of the movable body and the detection electrode section and continuously detecting acceleration or the like even if excessive acceleration or the like is applied.

Application Example 2

In the sensor element according to the application example described above, it is preferable that the detection electrode section includes a first detection electrode section and a second detection electrode section disposed at positions that face the movable body, and that the protruding section includes a first protruding section that is provided in a region where the first detection electrode section is provided in the plan view of the detection electrode section seen in the vertical direction and protrudes toward the movable body and a second protruding section that is provided in a region where the second detection electrode section is provided in the plan view of the detection electrode section seen in the vertical direction and protrudes toward the movable body.

According to the sensor element having this configuration, the first detection electrode section and the second detection electrode section are provided, and the movable body is provided to face these detection electrode sections. Further, the first protruding section and the second protruding section of which at least a part of the surface includes the insulating material are provided. The first protruding section is provided to protrude from the region where the first detection electrode section is provided toward the movable body. Further, the second protruding section is provided to protrude from the region where the second detection electrode section is provided toward the movable body.

If the movable body is excessively displaced due to acceleration or the like applied to the sensor element, the movable body comes into contact with the first protruding section, the second protruding section or both the protruding sections. Here, since the movable body comes into contact with the first protruding section, the second protruding section or both the protruding sections of which at least a part of the surface is made of the insulating material, it is possible to suppress contact of the movable body and the detection electrode section and a short circuit due to the contact, and to suppress loss of an electrostatic capacitance generated between the movable body and the detection electrode section.

Accordingly, it is possible to obtain a sensor element capable of suppressing contact of the movable body and the detection electrode section and continuously detecting acceleration or the like even if excessive acceleration or the like is applied.

Application Example 3

In the sensor element according to the application example described above, it is preferable that the detection electrode section and the protruding section are provided on a substrate, and that the protruding section is provided integrally with the substrate.

According to the sensor element having this configuration, the detection electrode section and the protruding section are provided on one surface of the substrate. Further, the protruding section extends from the substrate, and is provided integrally with the substrate.

Thus, it is possible to provide the protruding section with a simple structure.

Application Example 4

In the sensor element according to the application example described above, it is preferable that the protruding section is configured so that the detection electrode section is provided on the surface thereof and the insulating material is provided at a portion thereof that comes into contact with the movable body.

According to the sensor element having this configuration, the detection electrode section is provided on the surface of the protruding section, and the insulating material is provided at the portion of the protruding section that comes into contact with the movable body.

Thus, since the detection electrode section covers the protruding section made of the insulating material, it is possible to block an electric field generated between the movable body and the protruding section.

Further, since the insulating material is provided at the portion, which comes into contact with the movable body, of the detection electrode section provided on the protruding section, it is possible to suppress a short circuit of the movable body and the detection electrode section.

Accordingly, even if electric charges are generated in the protruding section made of the insulating material due to charging, it is possible to suppress the movable body from being pulled toward the protruding section.

Accordingly, it is possible to obtain a sensor element in which erroneous detection of acceleration or the like applied to the sensor element is suppressed.

Application Example 5

In the sensor element according to the application example described above, it is preferable that the sensor element further includes a dummy electrode section that is disposed to face the movable body in at least a part thereof and is electrically insulated from the detection electrode section.

According to the sensor element having this configuration, since there are provided the detection electrode section and the dummy electrode section that is disposed to face the movable body in at least a part thereof and is electrically insulated from the detection electrode section, it is possible to reduce an exposed area of the substrate, and to block electric charges based on charging of the substrate.

Accordingly, as the dummy electrode section is provided, it is possible to suppress the exposed area of the substrate, and to block an electric field generated between the substrate and the movable body due to the charging. Thus, it is possible to obtain a sensor element in which the pull of the movable body toward the substrate is suppressed and the detection accuracy of acceleration or the like is enhanced.

Application Example 6

In the sensor element according to the application example described above, it is preferable that the detection electrode section and the dummy electrode section are provided on the substrate, and a groove section is provided in at least one of a region between the detection electrode section and the dummy electrode section and a region between the first detection electrode section and the second detection electrode section of the detection electrode section.

According to the sensor element having this configuration, since the region between the detection electrode section and the dummy electrode section provided on the substrate and the region between the first detection electrode section and the second detection electrode section are electrically insulated, an exposed portion of the substrate is formed in each boundary section of the respective electrode sections. Thus, the groove section is provided on the substrate between the respective electrode sections. As the groove section is provided, in the sensor element, it is possible to increase a distance between the movable body and an exposed surface of the substrate between the respective electrode sections. Accordingly, as the groove section is provided, it is possible to obtain a sensor element capable of increasing the distance between the movable body and the exposed surface of the substrate, reducing electrostatic attraction acting on the movable body due to charging of the substrate and suppressing the movable body from being pulled toward the substrate.

Application Example 7

In the sensor element according to the application example described above, it is preferable that a protrusion that protrudes toward the movable body is provided along an outer edge of the groove section.

According to the sensor element having this configuration, the protrusion that protrudes toward the movable body is provided along the outer edge of the groove section. In this sensor element, although a leakage of an electric field due to the charging of the substrate occurs from the boundary section of the first detection electrode section and the second detection electrode section, the electric field acting on the first detection electrode section and the second detection electrode section is reduced by the protrusion provided along the outer edge of the groove section. Accordingly, it is possible to suppress the influence on the electrostatic capacitances generated between the movable body and the first detection electrode section and between the movable body and the second detection electrode section.

Application Example 8

In the sensor element according to the application example described above, it is preferable that the dummy electrode section is at a fixed electric potential, or be electrically connected to the movable body.

According to the sensor element having this configuration, the dummy electrode section is at the fixed electric potential, or is electrically connected to the movable body. As the dummy electrode section is at the fixed electric potential, it is possible to suppress an electrostatic capacitance generated between the movable body and the dummy electrode section, and to suppress an electrostatic attraction generated on the movable body. Further, as the dummy electrode section is connected to the movable body, the dummy electrode section is at the same electric potential as in the movable body, and thus, it is possible to suppress an electrostatic capacitance generated between the dummy electrode section and the movable body, and to suppress an electrostatic attraction generated on the movable body.

Application Example 9

In the sensor element according to the application example described above, it is preferable that at least one of the detection electrode section and the dummy electrode section extends on a bottom surface of the groove section.

According to the sensor element having this configuration, at least one of the detection electrode section and the dummy electrode section extends on the bottom surface of the groove section. Thus, in this sensor element, it is possible to reduce an exposed portion of the substrate as much as possible, to suppress a leakage of an electric field due to charging from the substrate, and to suppress the influence on an electrostatic capacitance generated between the movable body and the detection electrode section. Further, it is possible to suppress electrostatic attraction generated on the movable body as the leakage of the electric field due to the charging of the substrate occurs from the substrate.

Application Example 10

This application example is directed to a sensor element including: a detection electrode section; a movable body that is provided to face the detection electrode section; and a protruding section that protrudes toward the movable body, in which the detection electrode section includes a first detection electrode section and a second detection electrode section that are disposed at positions that face the movable body, and the protruding section is provided between the first detection electrode section and the second detection electrode section in a plan view of the detection electrode section seen in a vertical direction.

According to the sensor element having this configuration, the first detection electrode section and the second detection electrode section are provided, and the movable body is provided to face these detection electrode sections. Further, the protruding section that protrudes toward the movable body is provided between the first detection electrode section and the second detection electrode section.

The movable body may be displaced by acceleration or the like applied to the sensor element. As the detection electrode section and the movable body are provided to face each other, an electrostatic capacitance is generated therebetween. The electrostatic capacitance is changed according to change in an interval between the detection electrode section and the movable body due to the acceleration or the like applied to the sensor element.

If the movable body is excessively displaced by the acceleration or the like applied to the sensor element, the movable body comes into contact with the protruding section. As the movable body comes into contact with the protruding section, it is possible to suppress contact of the movable body and the detection electrode section and a short circuit due to the contact, and to suppress loss of an electrostatic capacitance generated between the movable body and the detection electrode section.

Accordingly, it is possible to obtain a sensor element capable of suppressing contact of the movable body and the detection electrode section and continuously detecting acceleration or the like even if excessive acceleration or the like is applied.

Application Example 11

This application example is directed to an electronic apparatus including any of the sensor elements according to the application examples described above.

According to the electronic apparatus having this configuration, as the sensor element capable of suppressing contact of the movable body and the detection electrode section and continuously detecting acceleration or the like even if excessive acceleration or the like is applied is mounted, it is possible to enhance reliability.

Application Example 12

This application example is directed to a moving object including any of the sensor elements according to the application examples described above.

According to the moving object having this configuration, as the sensor element capable of suppressing contact of the movable body and the detection electrode section and continuously detecting acceleration or the like even if excessive acceleration or the like is applied is mounted, it is possible to enhance reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
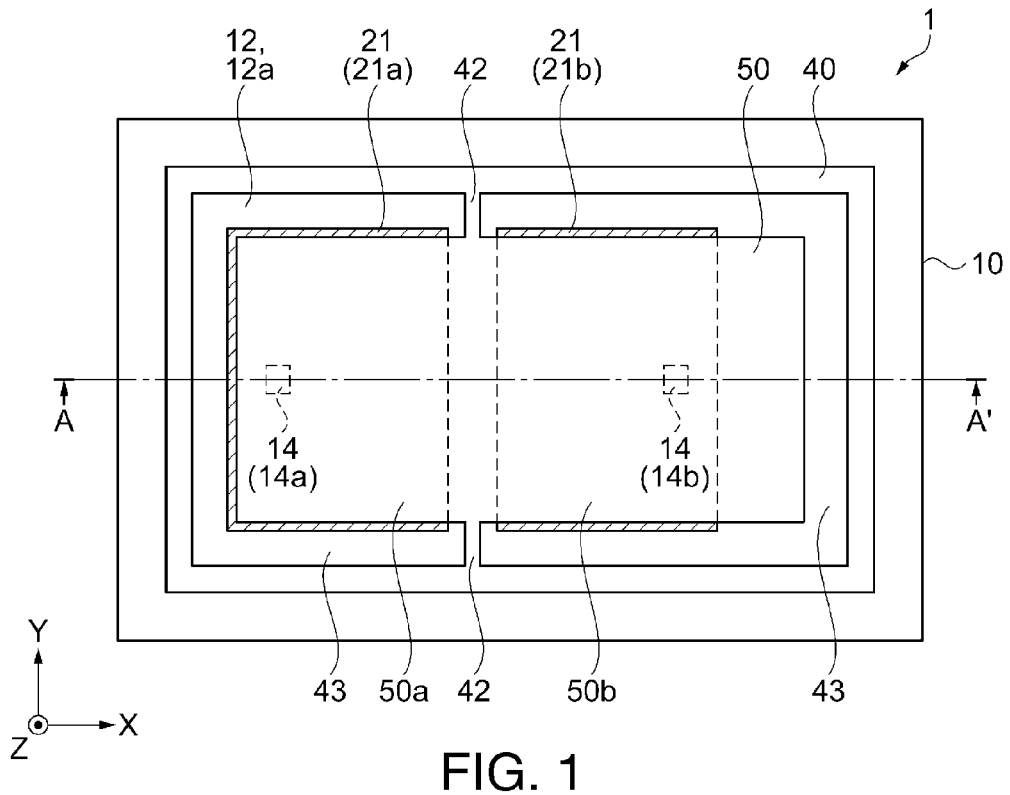
FIG. 1 is a plan view schematically illustrating a sensor element according to a first embodiment.

Hereinafter, embodiments of the invention will be described with reference to the accompanying drawings. In the following drawings, since respective components are shown with recognizable sizes in the drawings, sizes and scales of the respective components may be appropriately different from those of real components.

First Embodiment

A sensor element according to a first embodiment will be described with reference to FIG. 1 to FIGS. 3A, 3B and 3C.

Figure 2:
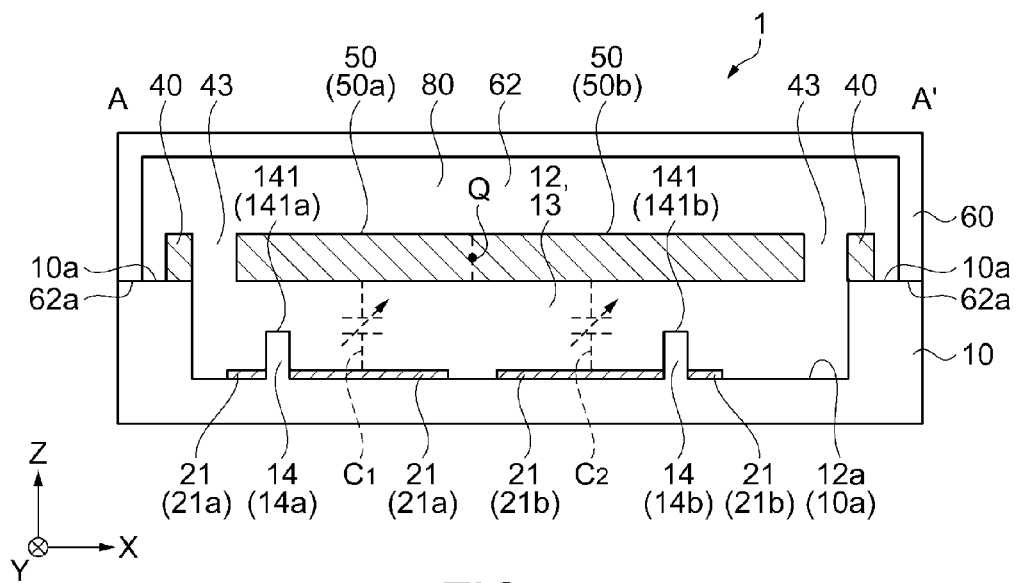
FIG. 2 is a cross-sectional view schematically illustrating the sensor element according to the first embodiment.
Figure 3A:
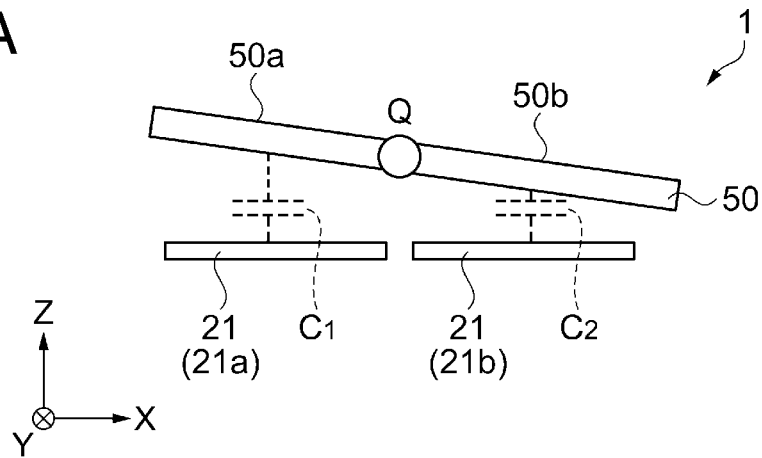
FIGS. 3A to 3C are diagrams schematically illustrating an operation of the sensor element according to the first embodiment.
Figure 3B:
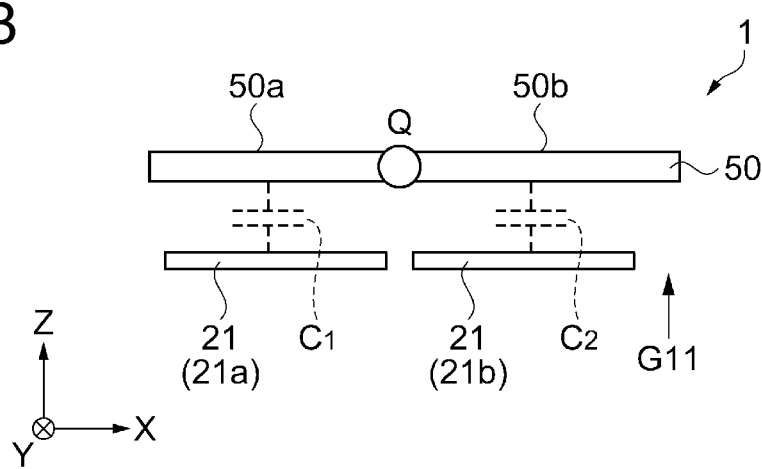
Figure 3C:
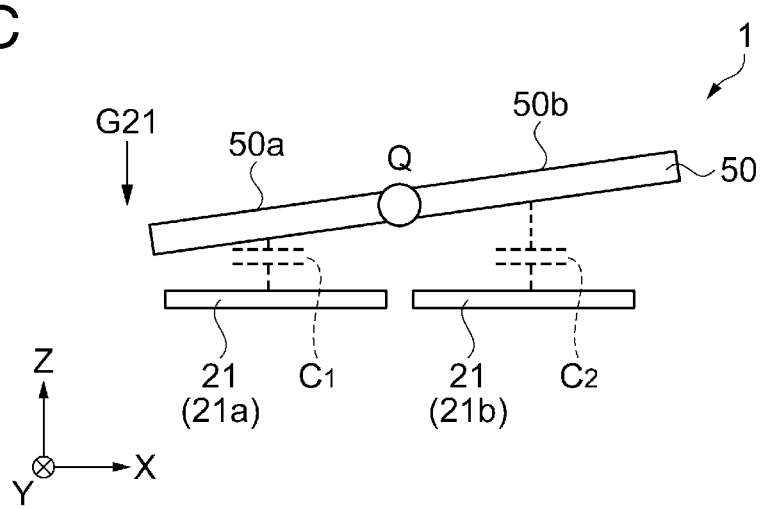

FIG. 1 is a plan view schematically illustrating a sensor element according to the first embodiment. FIG. 2 is a cross-sectional view schematically illustrating the sensor element taken along line A-A' in FIG. 1. FIGS. 3A to 3C are diagrams schematically illustrating an operation of the sensor element according to the first embodiment.

For ease of description, a cover is not shown in FIG. 1. Further, only a movable body and a detection electrode section are shown in FIGS. 3A to 3C. In FIG. 1 to FIGS. 3A, 3B and 3C, an X axis, a Y axis and a Z axis are shown as three axes that are orthogonal to each other. The Z axis is an axis indicating a thickness direction where the cover overlaps a substrate.

Structure of Sensor Element 1

The sensor element 1 of the present embodiment may be used as an inertial sensor, for example. Specifically, the sensor element 1 may be used as a sensor (an electrostatic capacitance type acceleration sensor or an electrostatic capacitance type MEMS acceleration sensor) for measuring acceleration in a vertical direction (Z axis direction).

As shown in FIGS. 1 and 2, the sensor element 1 is provided with a substrate 10, a protruding section 14 provided on the substrate 10, and a detection electrode section 21. Further, the sensor element 1 is provided with a movable body 50 supported by a frame section 40 through a support section 42, and a cover 60 that covers these components.

Substrate 10

The substrate 10 is a substrate on which the protruding section 14 and the detection electrode section 21 and the like are provided. In the substrate 10, a first recessed section 12 is provided in one surface thereof where the protruding section 14, the detection electrode section 21 and the like are provided.

In a plan view in the Z axis direction that is a direction vertical to the substrate 10, the first recessed section 12 includes a first bottom surface 12a that includes the detection electrode section 21 and the movable body 50 and is provided to overlap the detection electrode section 21 and the movable body 50.

As a material of the substrate 10, for example, borosilicate glass or the like may be used.

In the following description, the one surface of the substrate 10 that is provided with the first recessed section 12 and is coupled with the cover 60 (to be described later) is referred to as a main surface 10a.

Detection Electrode Section 21

In the plan view in the Z axis direction that is the direction vertical to the first bottom surface 12a, the detection electrode section 21 overlaps the first bottom surface 12a, and at least a part thereof overlaps the movable body 50. Further, the detection electrode section 21 is provided on the first bottom surface 12a with an interval 13 with respect to the movable body 50. The detection electrode section 21 includes a first detection electrode section 21a and a second detection electrode section 21b. The first detection electrode section 21a and the second detection electrode section 21b are electrically insulated from each other.

In the plan view in the Z axis direction that is the direction vertical to the movable body 50, the detection electrode section 21 is provided on both sides of the first bottom surface 12a with reference to a supporting shaft Q on which the movable body 50 is inclined.

On the first bottom surface 12a, the first detection electrode section 21a is provided on one side of the both sides with reference to the supporting shaft Q, and the second detection electrode section 21b is provided on the other side of the both sides with reference to the supporting shaft Q.

Specifically, in the detection electrode section 21, the first detection electrode section 21a is provided in a -X axis direction shown in FIG. 1 with reference to the supporting shaft Q to overlap a first movable body 50a (movable body 50) in a part thereof. Further, in the detection electrode section 21, the second detection electrode section 21b is provided in a +X axis direction shown in FIG. 1 with reference to the supporting shaft Q to overlap a second movable body 50b (movable body 50) in a part thereof.

It is preferable that the first detection electrode section 21a and the second detection electrode section 21b have the same surface area. Further, it is preferable that an area where the first movable body 50a (movable body 50) overlaps the first detection electrode section 21a and an area where the second movable body 50b (movable body 50) overlaps the second detection electrode section 21b are the same. This configuration is provided for the purpose of detecting a direction of a force applied to the sensor element 1 due to a difference between an electrostatic capacitance (electric charges) generated between the first movable body 50a and the second movable body 50b and an electrostatic capacitance (electric charges) generated between the first detection electrode section 21a and the second detection electrode section 21b.

As a material of the detection electrode section 21, a material having conductivity is used. As the material of the detection electrode section 21, for example, a conductive member that contains gold (Au), copper (Cu), aluminum (Al), indium (I), titanium (Ti), platinum (Pt), tungsten (W), tin (Sn), silicon (Si) or the like may be used.

Protruding Section 14

The protruding section 14 protrudes from the first bottom surface 12a to the movable body 50, and is provided with a top surface 141 at an end thereof opposite to one end thereof on the side of the first bottom surface 12a. The protruding section 14 is provided to form the interval 13 between the top surface 141 and the movable body 50. The protruding section includes a first protruding section 14a and a second protruding section 14b.

The first protruding section 14a overlaps a region where the first detection electrode section 21a is provided in the plan view of the detection electrode section 21 seen in the Z axis direction that is the direction vertical to the detection electrode section 21, and is provided so that the top surface 141a is exposed from the first detection electrode section 21a. Further, the first protruding section 14a is provided to form the interval 13 between the top surface 141a and the movable body 50.

The second protruding section 14b overlaps a region where the second detection electrode section 21b is provided in the plan view of the detection electrode section 21 seen in the Z axis direction that is the direction vertical to the detection electrode section 21, and is provided so that the top surface 141b is exposed from the second detection electrode section 21b. Further, the second protruding section 14b is provided to form the interval 13 between the top surface 141b and the movable body 50.

As a material of the protruding section 14, an insulating material may be used. As the material of the protruding section 14, for example, borosilicate glass may be used similarly to the substrate 10.

Frame Section 40, Support Section 42 and Movable Body 50

The movable body 50 is provided to be separated from the detection electrode section 21 provided on the first bottom surface 12a with the interval 13. The movable body 50 is supported by the frame section 40 with the support section 42 that extends from the supporting shaft Q on which the movable body 50 is inclined. The frame section 40 is provided on the main surface 10a of the substrate 10 along an outer peripheral edge of the first recessed section 12.

Movable Body 50

The movable body 50 includes the first movable body 50a and the second movable body 50b with reference to the supporting shaft Q. Since the movable body 50 is supported on the frame section 40 provided on the main surface 10a through the support section 42, it is possible to separate the movable body 50 from the detection electrode section 21 with the interval 13. Since the movable body 50 is provided to be separated from the detection electrode section 21 with the interval 13, the movable body 50 can perform a seesaw operation using the supporting shaft Q as a supporting point.

Further, as the movable body 50 performs the seesaw operation with reference to the supporting shaft Q as the supporting point, a distance of the interval 13 with respect to the detection electrode section 21 is changed. As the distance of the interval 13 between the movable body 50 and the detection electrode section 21 is changed, it is possible to change an electrostatic capacitance generated between the movable body 50 and the detection electrode section 21.

The supporting shaft Q of the movable body 50 is provided to be shifted toward the first movable body 50a. Accordingly, the movable body 50 is inclined toward the second movable body 50b when a force such as acceleration is not applied to the sensor element 1 (when the movable body 50 is not oscillated). When the force such as acceleration is not applied, since the movable body 50 is inclined in a certain direction, it is possible to suppress detection offset by the force such as acceleration.

An electrostatic capacitance (variable electrostatic capacitance) is generated between the movable body 50 and the detection electrode section 21. Specifically, an electrostatic capacitance (variable electrostatic capacitance) C1 is formed between the movable body 50 (the first movable body 50a) and the first detection electrode section 21a. Further, an electrostatic capacitance (variable electrostatic capacitance) C2 is formed between the movable body 50 (the second movable body 50b) and the second detection electrode section 21b.

The electrostatic capacitances C1 and C2 are changed according to the interval 13 (distance) between the detection electrode section 21 and the movable body 50.

For example, the electrostatic capacitances C1 and C2 have approximately the same electrostatic capacitance value in a state where the movable body 50 is horizontal to the substrate 10. Here, since the distance (size) of the interval 13 between the movable body 50 and the first detection electrode section 21a and the distance (size) of the interval 13 between the movable body 50 and the second detection electrode section 21b become equal, the electrostatic capacitance values of the electrostatic capacitances C1 and C2 also become equal.

Further, for example, the electrostatic capacitance values of the electrostatic capacitances C1 and C2 are changed according to the inclination of the movable body 50 in a state where the movable body 50 is inclined with reference to the supporting shaft Q as the supporting point. Here, since the distance (size) of the interval 13 between the movable body 50 and the first detection electrode section 21a and the distance (size) of the interval 13 between the movable body 50 and the second detection electrode section 21b are different from each other according to the inclination of the movable body 50, the electrostatic capacitances C1 and C2 have different electrostatic capacitance values according to the distance (size) of the interval 13.

Support Section 42

The support section 42 extends from the supporting shaft Q of the movable body 50 toward the frame section 40.

The support section 42 may function as a torsional spring (twist spring). The support section 42 may be twisted in a rotation axis direction of the supporting shaft Q. As the support section 42 functions as the torsional spring, the movable body 50 may be inclined (perform the seesaw operation) according to acceleration.

The support section 42 has toughness against "torsional deformation" generated as the movable body 50 is inclined, thereby making it possible to prevent the support section 42 from being damaged.

The movable body 50 shown in FIGS. 1 and 2 is in an approximately horizontal state with respect to the substrate 10 for description of the configuration of the sensor element 1. However, since the supporting shaft Q is provided to be shifted toward the first movable body 50a, the movable body 50 is initially inclined toward the second movable body 50b. The inclination (seesaw operation) of the movable body 50 will be described later.

Frame Section 40

In the plan view in the Z axis direction that is the direction vertical to the substrate 10, the frame section 40 is provided on the main surface 10a of the substrate 10 along the outer peripheral edge of the first recessed section 12. The frame section 40 is provided on the main surface 10a with an interval 43 with respect to the movable body 50.

The movable body 50 is supported on the frame section 40 by the support section 42, as shown in FIG. 1.

Since the movable body 50 has the interval 43 between the frame section 40 and the movable body 50 and the interval 13 between the detection electrode section 21 and the movable body 50, the movable body 50 can perform the seesaw operation with reference to the support section 42 as the supporting shaft Q.

In the sensor element 1 of the present embodiment, the frame section 40, the support section 42 and the movable body 50 may be provided by patterning one substrate that is a single body.

As a material of the movable body 50, it is preferable that a material having conductivity is used. This is because the movable body 50 functions as an electrode.

When the frame section 40 and the support section 42 are integrally formed, for example, it is preferable to use a material that is easily machined by a photolithography method or the like, such as a silicon substrate.

The material of the frame section 40 is not particularly limited, and a variety of materials may be used. When the movable body 50 and the support section 42 are integrally formed, for example, it is preferable to use a material that is easily machined by a photolithography method or the like, such as a silicon substrate.

The material of the support section 42 is not particularly limited, and a variety of materials may be used as long as the material has toughness. When the movable body 50 and the frame section 40 are integrally formed, for example, it is preferable to use a material that is easily machined by a photolithography method or the like, such as a silicon substrate.

The frame section 40, the support section 42 and the movable body 50 may be formed of an insulating material. When the movable body 50 is formed of the insulating material, an electrode film having conductivity may be formed on the surface thereof that faces the detection electrode section 21.

Cover 60

The cover 60 is provided to be coupled with the substrate 10. A second recessed section 62 is provided in the cover 60. The cover 60 is coupled with the main surface 10a of the substrate 10 using a top surface around the second recessed section 62 as a bonding surface 62a, to thereby form a cavity 80 that is a space surrounded by the first recessed section 12 provided in the substrate 10 and the second recessed section 62 provided in the cover 60. As the movable body 50 or the like is accommodated in the cavity 80 formed by the substrate 10 and the cover 60, it is possible to protect the movable body 50 and the like from disturbance against the sensor element 1.

It is preferable that the second recessed section 62 is provided to have such a depth that the movable body 50 does not come into contact with the cover 60 when the movable body 50 is inclined, in a direction where the substrate 10 is coupled with the cover 60. Further, it is preferable that the second recessed section 62 is provided to have a depth larger than the thickness of the movable body 50, at least in a direction where the movable body 50 is inclined.

The cover 60 is grounded by a wire (not shown).

As a material of the cover 60, it is preferable that a material having conductivity is used. The cover 60 of the present embodiment employs a silicon substrate that is easily machined, for example. As the cover 60 employs the silicon substrate, it is possible to couple (bond) the cover 60 with the substrate 10 that uses the borosilicate glass by an anode bonding method.

Wiring Section

A wiring section (not shown) that extracts the above-described electrostatic capacitances (C1 and C2) generated between the detection electrode section 21 and the movable body 50 as electric signals is provided in the sensor element 1. It is possible to extract the electrostatic capacitances generated according to the inclination of the movable body 50 to the outside of the sensor element 1 through the wiring section.

However, it is preferable that the above-described sensor element 1 recognizes a small change of acceleration or the like. Accordingly, it is preferable that the movable body 50 that is inclined according to acceleration is provided to be easily inclined (perform the seesaw operation) according to the acceleration or the like applied thereto.

In the sensor element 1, since the detection electrode section 21 is provided on the first bottom surface 12a to face the movable body 50, an insulating material is used as the material of the substrate 10 on which the detection electrode section 21 is provided. In the sensor element 1, as the borosilicate glass that is the insulating material is used as the material of the substrate 10, the substrate 10 is easily charged. When the substrate 10 is charged, the movable body 50 may be pulled toward the substrate 10 by an electrostatic attraction (pull).

Thus, there is a concern that the movable body 50 comes into contact with the detection electrode section 21 provided on the first bottom surface 12a. If the movable body 50 comes into contact with the detection electrode section 21, the loss of the electrostatic capacitances (C1 and C2) generated between the movable body 50 and the detection electrode section 21 occurs, thereby making it impossible to measure acceleration or the like as the sensor element 1.

Thus, in the sensor element 1 of the invention, since when the movable body 50 is pulled toward the substrate 10, the movable body 50 comes into contact with the protruding section 14, it is possible to suppress the movable body 50 from being in contact with the detection electrode section 21, and to suppress the loss of the electrostatic capacitances.

Operation of Sensor Element 1

An operation of the sensor element 1 of the present embodiment will be described.

FIGS. 3A to 3C are diagrams schematically illustrating the operation of the sensor element 1, in which the components other than the detection electrode section 21 and the movable body 50 are not shown.

When acceleration (for example, a gravity acceleration) in the vertical direction (Z axis direction) is applied to the sensor element 1, for example, a rotation moment (force moment) centering around the supporting shaft Q is generated in the movable body 50.

FIG. 3A shows a state where acceleration is not applied to the sensor element 1, or a state where acceleration is uniformly applied to both sides (the first movable body 50a and the second movable body 50b) of the movable body 50 with reference to the supporting shaft Q.

In this state, in the movable body 50, a gravity acceleration larger than that of the first movable body 50a acts on the second movable body 50b. Accordingly, a clockwise force centering around the supporting shaft Q as a rotation axis acts on the movable body 50. This is because the supporting shaft Q is shifted toward the first movable body 50a. Accordingly, the movable body 50 is inclined toward the second detection electrode section 21b.

Thus, the interval 13 between the movable body 50 (the second movable body 50b) and the second detection electrode section 21b decreases (becomes short), and the electrostatic capacitance value of the electrostatic capacitance C2 between the movable body 50 and the second detection electrode section 21b increases. On the other hand, the interval 13 between the movable body 50 (the first movable body 50a) and the first detection electrode section 21a increases (becomes long), and the electrostatic capacitance value of the electrostatic capacitance C1 between the movable body 50 and the first detection electrode section 21a decreases.

FIG. 3B shows a state where an acceleration G11 is applied to the movable body 50 from the −Z axis direction side to the +Z axis direction side in the sensor element 1.

In this state, in the sensor element 1, since the acceleration G11 is applied to the second movable body 50b, a counterclockwise force centering around the supporting shaft Q as the rotation axis acts on the movable body 50. Accordingly, the movable body 50 is inclined toward the first detection electrode section 21a. In FIG. 3B, a state where the gravity acceleration acting on the second movable body 50b and the acceleration G11 are approximately equal to each other is shown. Thus, the movable body 50 is approximately horizontal with respect to the substrate 10.

Thus, the interval 13 between the movable body 50 (the first movable body 50a) and the first detection electrode section 21a and the interval 13 between the movable body 50 (the second movable body 50b) and the second detection electrode section 21b are approximately equal to each other. Accordingly, the electrostatic capacitance values of the electrostatic capacitance C1 between the movable body 50 and the first detection electrode section 21a and the electrostatic capacitance C2 between the movable body 50 and the second detection electrode section 21b are approximately equal to each other.

Further, compared with a case where the acceleration is not applied to the sensor element 1, shown in FIG. 3A, the interval 13 between the movable body 50 (the first movable body 50a) and the first detection electrode section 21a decreases, and the electrostatic capacitance C1 generated between the both components increases. Further, the interval 13 between the movable body 50 (the second movable body 50b) and the second detection electrode section 21b increases, and the electrostatic capacitance value of the electrostatic capacitance C2 generated between the both components decreases.

FIG. 3C shows a state where an acceleration G21 is applied to the movable body 50 from the +Z axis direction side to the −Z axis direction side in the sensor element 1.

In this state, since the acceleration G21 is applied to the first movable body 50a, a counterclockwise force centering around the supporting shaft Q as the rotation axis acts on the movable body 50. Accordingly, the movable body 50 is inclined toward the first detection electrode section 21a. In FIG. 3C, a state where the acceleration G21 is larger than the gravity acceleration acting on the second movable body 50b is shown. Thus, the movable body 50 is inclined toward the first detection electrode section 21a.

Thus, the interval 13 between the movable body 50 (the first movable body 50a) and the first detection electrode section 21a decreases (becomes short), and the electrostatic capacitance value of the electrostatic capacitance C1 between the movable body 50 and the first detection electrode section 21a increases. On the other hand, the interval 13 between the movable body 50 (the second movable body 50b) and the second detection electrode section 21b increases (becomes long), and the electrostatic capacitance value of the electrostatic capacitance C2 between the movable body 50 and the second detection electrode section 21b decreases.

Further, compared with a case where the acceleration is not applied to the sensor element 1, shown in FIG. 3A, the interval 13 between the movable body 50 (the first movable body 50a) and the first detection electrode section 21a decreases, and the electrostatic capacitance C1 generated between the both sections increases. Further, the interval 13 between the movable body 50 (the second movable body 50b) and the second detection electrode section 21b increases, and the electrostatic capacitance value of the electrostatic capacitance C2 generated between the both sections decreases.

According to the sensor element 1 of the present embodiment, it is possible to detect values of the accelerations (for example, G11 and G21) from the degree of change in two electrostatic capacitance values. For example, by determining the change of the capacitance value in the state shown in FIG. 3C with reference to the change (the size and direction of the acceleration G11) of the capacitance value obtained from the state shown in FIG. 3B, it is possible to detect the direction and force where the acceleration G21 acts.

It is possible to detect the size and direction of the acceleration by the change (difference) of the electrostatic capacitance values of the electrostatic capacitances C1 and C2.

According to the above-described first embodiment, it is possible to obtain the following effects.

According to the sensor element 1, the first protruding section 14a and the second protruding section 14b that protrude from the first bottom surface 12a toward the movable body 50 are provided.

As the movable body 50 comes into contact with the first protruding section 14a or the second protruding section 14b when excessively inclined, it is possible to suppress the movable body 50 from being in contact with the detection electrode section 21 and a short circuit due to the contact.

Accordingly, it is possible to suppress loss of the electrostatic capacitances C1 and C2 generated between the movable body 50 and the detection electrode section 21.

Thus, it is possible to obtain the sensor element 1 capable of suppressing the contact between the movable body 50 and the detection electrode section 21 and the short circuit due to the contact and of continuously detecting acceleration even if excessive acceleration or the like is applied.

Second Embodiment

A sensor element according to a second embodiment will be described with reference to FIG. 4.

Figure 4:
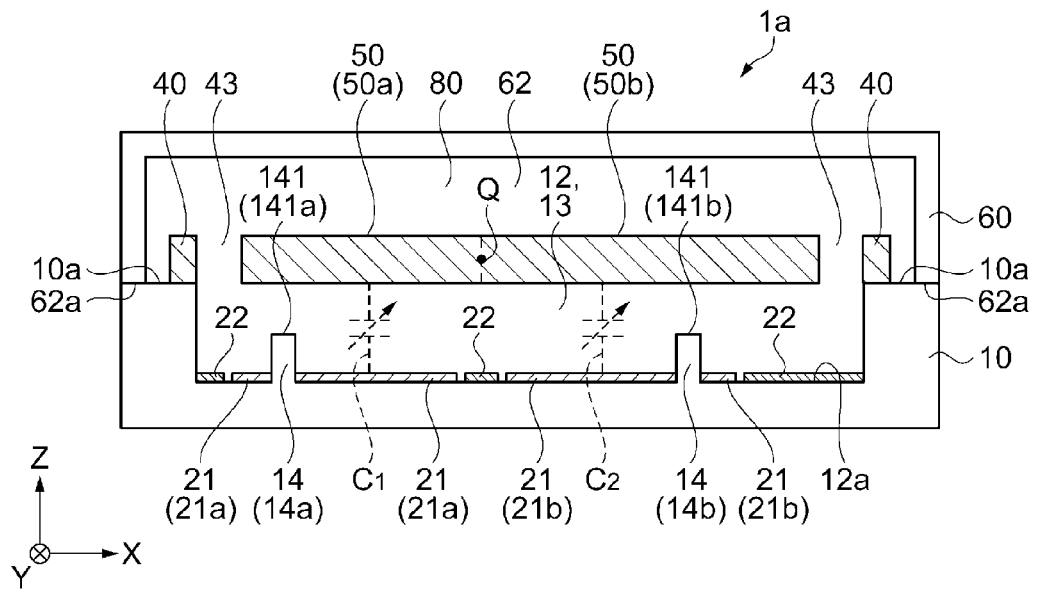
FIG. 4 is a cross-sectional view schematically illustrating a sensor element according to a second embodiment.

FIG. 4 is a cross-sectional view schematically illustrating the sensor element according to the second embodiment. FIG. 4 is a diagram schematically illustrating a cross section of the sensor element, taken along line A-A' in FIG. 1.

In FIG. 4, the X axis, the Y axis and the Z axis are shown as three axes that are orthogonal to each other. The Z axis is an axis indicating a thickness direction where a cover overlaps a substrate.

A sensor element 1a according to the second embodiment is different from the sensor element 1 described in the first embodiment in that a dummy electrode section 22 is provided on the first bottom surface 12a of the first recessed section 12 provided in the substrate 10. Since the other configurations and the like in the sensor element 1a are approximately the same as in the sensor element 1, the same reference numerals are given to the same components and description thereof will not be repeated.

Structure of Sensor Element 1a

The sensor element 1a shown in FIG. 4 may be used as a sensor for measuring acceleration in a vertical direction (Z axis direction), for example, similar to the sensor element 1 described in the first embodiment.

As shown in FIG. 4, the sensor element 1a is provided with the substrate 10, the protruding section 14 provided on the substrate 10, the detection electrode section 21, and the dummy electrode section 22. Further, the sensor element 1a is provided with the movable body 50 supported by the frame section 40 through the support section 42, and the cover 60 that covers these components.

Dummy Electrode Section 22

The sensor element 1a is provided with the dummy electrode section 22 on the first bottom surface 12a of the first recessed section 12.

The dummy electrode section 22 is electrically insulated from the detection electrode section 21, and is disposed on the first bottom surface 12a so as not to overlap the detection electrode section 21 in the plan view in the Z axis direction that is the direction vertical to the substrate 10. In other words, on the first bottom surface 12a, the dummy electrode section 22 is disposed separately from the detection electrode section 21.

The dummy electrode section 22 is provided to block an electric field generated by the charging of the substrate 10, and is ground or connected to the movable body 50 by a wiring (not shown). As the dummy electrode section 22 is grounded, the dummy electrode section 22 is fixed to a constant electric potential. The dummy electrode section 22 is grounded so that its electric potential is fixed, and may have approximately the same electric potential as that of the cover 60 or the like. Accordingly, it is possible to make an electrostatic attraction generated between the movable body 50 and the dummy electrode section 22 and an electric attraction generated between the movable body 50 and the cover 60 or the like approximately the same.

Further, the dummy electrode section 22 may be connected to the movable body 50 to have approximately the same electric potential as that of the movable body 50. Accordingly, it is possible to suppress the generation of the electrostatic attraction between the dummy electrode section 22 and the movable body 50.

Since the other configurations are the same as in the sensor element 1, description thereof will not be repeated.

According to the above-described second embodiment, it is possible to obtain the following effects.

According to the sensor element 1a having such a configuration, by providing the dummy electrode section 22 that is electrically insulated from the detection electrode section 21 on the first bottom surface 12a, it is possible to suppress an exposed area of the substrate 10 on the first bottom surface 12a, and to block the electric field due to the charging of the substrate 10.

Accordingly, as the dummy electrode section 22 is provided, it is possible to suppress the exposed area of the substrate 10, and to block the electric field due to the charging.

Thus, it is possible to obtain the sensor element 1a capable of suppressing the movable body 50 from being pulled toward the substrate 10 and of detecting acceleration or the like with high accuracy.

Third Embodiment

A sensor element according to a third embodiment will be described with reference to FIG. 5.

Figure 5:
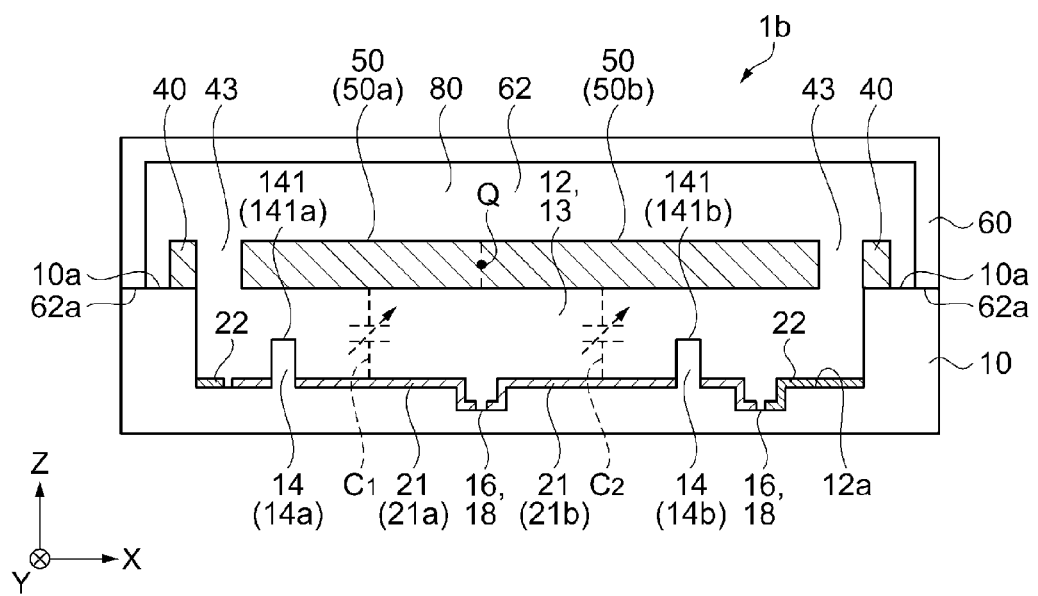
FIG. 5 is a cross-sectional view schematically illustrating a sensor element according to a third embodiment.

FIG. 5 is a cross-sectional view schematically illustrating the sensor element according to the third embodiment. FIG. 5 is a diagram schematically illustrating a cross section of the sensor element, taken along line A-A' in FIG. 1.

In FIG. 5, the X axis, the Y axis and the Z axis are shown as three axes that are orthogonal to each other. The Z axis is an axis indicating a thickness direction where a cover overlaps a substrate.

A sensor element 1b according to the third embodiment is different from the sensor element 1a described in the second embodiment in that groove sections 16 are provided in the first bottom surface 12a of the first recessed section 12 provided in the substrate 10. Since the other configurations in the sensor element 1b and the like are approximately the same as in the sensor elements 1 and 1a, the same reference numerals are given to the same components and description thereof will not be repeated.

Structure of Sensor Element 1b

The sensor element 1b shown in FIG. 5 may be used as a sensor for measuring acceleration in a vertical direction (Z axis direction), for example, similar to the sensor elements 1 and 1a of the above-described embodiments.

As shown in FIG. 5, the sensor element 1b is provided with the substrate 10, the protruding section 14 provided on the substrate 10, the detection electrode section 21 and the dummy electrode section 22. Further, the sensor element 1b is provided with the movable body 50 supported by the frame section 40 through the support section 42, and the cover 60 that covers these components. Further, in the sensor element 1b, the groove sections 16 are provided in a boundary section 18 between the first detection electrode section 21a and the second detection electrode section 21b that form the detection electrode section 21, and in a boundary section 18 between the detection electrode section 21 and the dummy electrode section 22.

Groove Section 16

The groove sections 16 are provided in the boundary sections 18 between the first detection electrode section 21a and the second detection electrode section 21b and between the detection electrode section 21 and the dummy electrode section 22.

Since the detection electrode section 21 and the dummy electrode section 22 are provided separately from each other and are electrically insulated from each other on the first bottom surface 12a, the first bottom surface 12a is exposed in the boundary sections 18.

Accordingly, when the substrate 10 is charged, a leakage of an electric field due to the charging occurs from the boundary section 18, which generates an electrostatic attraction that pulls the movable body 50 toward the substrate 10. Thus, in the plan view of the movable body 50 in the Z axis direction that is the direction vertical to the substrate 10, the groove sections 16 are provided in the boundary sections 18 that overlap the movable body 50.

Further, in the sensor element 1b, it is preferable to reduce the size of the first bottom surface 12a that is exposed in the boundary section 18 as much as possible. Accordingly, the detection electrode section 21 and the dummy electrode section 22 extend on the bottom surface of the groove section 16.

By providing the groove sections 16, it is possible to increase the interval 13 between the movable body 50 and the boundary section 18 where the first bottom surface 12a of the substrate 10 is exposed, and to suppress the action of the electrostatic attraction on the movable body 50. In other words, it is possible to suppress the movable body 50 from being pulled electrostatically toward the substrate 10.

Since the other configurations and the like are the same as in the sensor elements 1 and 1a, description thereof will not be repeated.

According to the above-described third embodiment, it is possible to achieve the following effects.

According to the sensor element 1b having such a configuration, the groove sections 16 are provided in the boundary sections 18 in the regions that overlap the movable body 50, between the detection electrode section 21 provided on the first bottom surface 12a and the dummy electrode section 22, and between the first detection electrode section 21a and the second detection electrode section 21b.

Accordingly, by providing the groove sections 16, it is possible to lengthen the distance of the interval 13 between the movable body 50 and the first bottom surface 12a where the substrate 10 is exposed in the boundary section 18.

Accordingly, it is possible to obtain the sensor element 1b capable of reducing the electrostatic attraction for the movable body 50 due to the charging of the substrate 10 and suppressing the movable body 50 from being pulled to the substrate 10.

Fourth Embodiment

A sensor element according to a fourth embodiment will be described with reference to FIG. 6.

Figure 6:
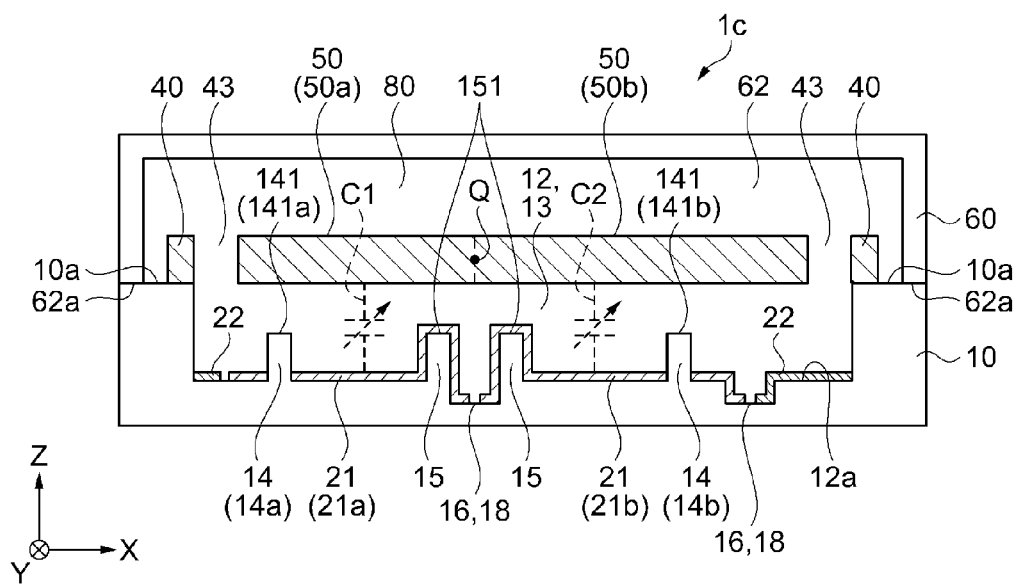
FIG. 6 is a cross-sectional view schematically illustrating a sensor element according to a fourth embodiment.

FIG. 6 is a cross-sectional view schematically illustrating the sensor element according to the fourth embodiment. FIG. 6 is a diagram schematically illustrating a cross section of the sensor element, taken along line A-A' in FIG. 1.

In FIG. 6, the X axis, the Y axis and the Z axis are shown as three axes that are orthogonal to each other. The Z axis is an axis indicating a thickness direction where a cover overlaps a substrate.

A sensor element 1c according to the fourth embodiment is different from the sensor element 1b described in the third embodiment in that a protrusion 15 is provided along the groove section 16 provided in the boundary section 18 between the first detection electrode section 21a and the second detection electrode section 21b. Since the other configurations in the sensor element 1c and the like are approximately the same as in the sensor elements 1, 1a and 1b, the same reference numerals are given to the same components and description thereof will not be repeated.

Structure of Sensor Element 1c

The sensor element 1c shown in FIG. 6 may be used as a sensor for measuring acceleration in a vertical direction (Z axis direction), for example, similar to the sensor elements 1, 1a and 1b of the above-described embodiments.

As shown in FIG. 6, the sensor element 1c is provided with the substrate 10, the protruding section 14 provided on the substrate 10, the protrusion 15, the detection electrode section 21 and the dummy electrode section 22. Further, the sensor element 1c is provided with the movable body 50 supported by the frame section 40 through the support section 42, and the cover 60 that covers these components. Further, the sensor element 1c is provided with the groove sections 16 in the boundary sections 18 between the first detection electrode section 21a and the second detection electrode section 21b that form the detection electrode section 21 and between the detection electrode section 21 and the dummy electrode section 22.

Protrusion 15

The sensor element 1c is provided with the above-described first protruding section 14a and the second protruding section 14b in the sensor element 1 of the first embodiment, and the protrusion 15.

The protrusion 15 is provided along the groove section 16 provided in the boundary section 18 between the first detection electrode section 21a and the second detection electrode section 21b provided on the first bottom surface 12a. The protrusion 15 protrudes from the first bottom surface 12a toward the movable body 50, and is provided with a top surface 151 at an end thereof opposite to one end thereof on the side of the first bottom surface 12a. The protrusion 15 is provided to form the interval 13 between the top surface 151 and the movable body 50.

Further, the detection electrode section 21 is provided to cover the protrusion 15. The first detection electrode section 21a and the second detection electrode section 21b that cover the protrusion 15 are provided to extend from the first bottom surface 12a toward the groove section 16, and are provided to be insulated from each other in the boundary section 18.

A leakage of an electric field due to charging of the substrate 10 occurs from the main surface 10a (first bottom surface 12a) exposed in the boundary section 18. However, by providing the protrusion 15, it is possible to achieve the effect of blocking the leakage of the electric field from the main surface 10a, it is possible to suppress the influence of the electric field on the electrostatic capacitances generated between the movable body 50 and the first detection electrode section 21a and between the movable body 50 and the second detection electrode section 21b.

Since the other configurations are the same as in the sensor elements 1, 1a and 1b, description thereof will not be repeated.

According to the above-described fourth embodiment, it is possible to achieve the following effects.

According to the sensor element 1c, the protrusion 15 that protrudes from the first bottom surface 12a toward the movable body 50 is provided along the groove section 16 provided between the first detection electrode section 21a and the second detection electrode section 21b.

The protrusion 15 is covered by the first detection electrode section 21a or the second detection electrode section 21b.

Accordingly, as the protrusion 15 is provided, it is possible to reduce the pull of the electric field leaked from the first bottom surface 12a exposed in the boundary section 18 with respect to the detection electrode section 21 and to suppress the influence of the electric field on the electrostatic capacitances C1 and C2 generated between the movable body 50 and the detection electrode section 21.

Accordingly, it is possible to achieve the sensor element 1c in which the induction due to the charging is suppressed.

Fifth Embodiment

A sensor element according to a fifth embodiment will be described with reference to FIGS. 7A and 7B.

Figure 7A:
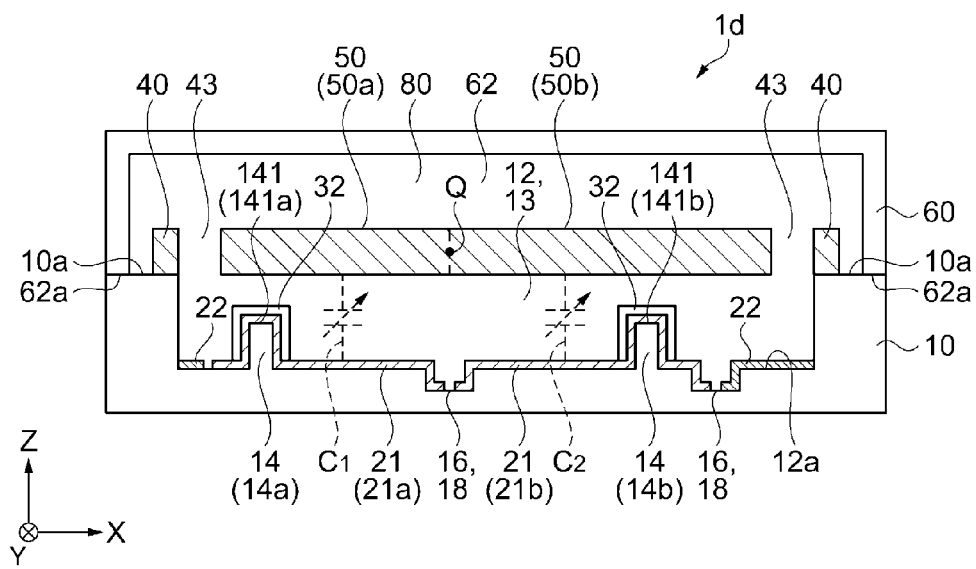
FIGS. 7A and 7B are a cross-sectional view and a partially enlarged view schematically illustrating a sensor element according to a fifth embodiment.
Figure 7B:
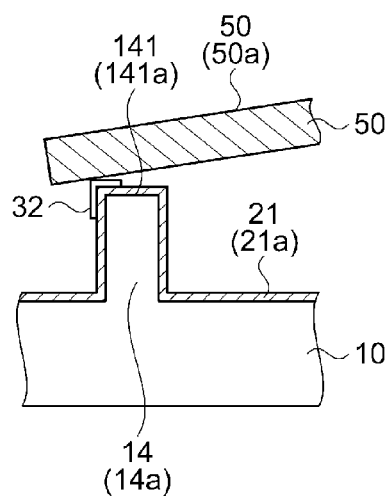

FIGS. 7A and 7B are views schematically illustrating the sensor element according to the fifth embodiment. FIG. 7A is a cross-sectional view schematically illustrating a cross section of the sensor element, taken along line A-A' in FIG. 1. FIG. 7B is an enlarged view schematically illustrating the first protruding section 14a. In FIGS. 7A and 7B, the X axis, the Y axis and the Z axis are shown as three axes that are orthogonal to each other. The Z axis is an axis indicating a thickness direction where a cover overlaps a substrate.

A sensor element 1d according to the fifth embodiment is provided with the groove sections 16 on the first bottom surface 12a, similar to the sensor element 1b described in the third embodiment. The sensor element 1d is different from the sensor element 1b described in the third embodiment in that the protruding section 14 is covered by the detection electrode section 21 and an insulating section 32 is provided to cover the detection electrode section 21 provided on the protruding section 14.

Since the other configurations in the sensor element 1d and the like are approximately the same as in the sensor element 1b described in the third embodiment, the same reference numerals are given to the same components and description thereof will not be repeated.

Structure of Sensor Element 1d

The sensor element 1d shown in FIG. 7A may be used as a sensor for measuring acceleration in a vertical direction (Z axis direction), for example, similar to the sensor element 1b of the above-described third embodiment.

As shown in FIG. 7A, the sensor element 1d is provided with the substrate 10, the protruding section 14 provided on the substrate 10, the detection electrode section 21 and the dummy electrode section 22. Further, the sensor element 1d is provided with the movable body 50 supported by the frame section 40 through the support section 42, and the cover 60 that covers these components. Further, the sensor element 1d is provided with the groove sections 16 in the boundary sections 18 between the first detection electrode section 21a and the second detection electrode section 21b that form the detection electrode section 21 and between the detection electrode section 21 and the dummy electrode section 22.

Protruding Section 14

In the protruding section 14 of the sensor element 1d of the present embodiment, the protruding section 14 is covered by the detection electrode section 21, and the insulating section 32 is provided to cover the detection electrode section 21 provided on the protruding section 14. Further, the protruding section 14 protrudes from the first bottom surface 12a toward the movable body 50, and is provided with the top surface 141 at one end thereof opposite to the other end thereof on the side of the first bottom surface 12a.

The protruding section 14 includes the first protruding section 14a and the second protruding section 14b.

The first protruding section 14a is provided to overlap the first detection electrode section 21a in the plan view in the Z axis direction that is the direction vertical to the detection electrode section 21, and is provided to form the interval 13 between the top surface 141a and the movable body 50.

The first protruding section 14a is covered by the first detection electrode section 21a, and the insulating section 32 is provided to cover the first detection electrode section 21a provided on the first protruding section 14a.

The second protruding section 14b is provided to overlap the second detection electrode section 21b in the plan view in the Z axis direction that is the direction vertical to the detection electrode section 21, and is provided to form the interval 13 between the top surface 141b and the movable body 50.

The second protruding section 14b is covered by the second detection electrode section 21b, and the insulating section 32 is provided to cover the second detection electrode section 21b provided on the second protruding section 14b.

In the sensor element 1d, with such a configuration, the cover 60 provided for protecting the movable body 50 provided on the substrate 10 is bonded to the substrate 10.

In the sensor element 1d, an anode bonding method is used as a method of bonding the substrate 10 including borosilicate glass and the cover 60 including silicon.

In the bonding of the substrate 10 and the cover 60 by means of the anode bonding method, the substrate 10 using the borosilicate glass that contains an alkaline metal element (movable element) such as sodium and the cover 60 using the silicon having conductivity are mounted in a space at high temperature (about 300° C. to about 500° C.). It is preferable that the space is in an atmosphere of an inert gas (nitrogen, argon, helium or the like) or in a vacuum. Further, a high voltage (about 500 V to 1000 V) is applied between the substrate 10 and the cover 60. Thus, a covalent bond occurs (in an interface) between the main surface 10a and the bonding surface 62a to be bonded, and thus, the substrate 10 and the cover 60 are strongly bonded to each other.

When the anode bonding method is used, in the substrate 10, Na (sodium) ions contained in the substrate 10 move toward a side thereof opposite to the main surface 10a bonded to the bonding surface 62a of the cover 60. As the Na ions move, a depletion layer is generated on a side (main surface 10a) of the substrate 10 that faces the bonding surface 62a, and thus, the main surface 10a and the first bottom surface 12a are easily charged.

Since the substrate 10 is easily charged as the Na ions of the substrate 10 move, an electrostatic attraction acts on the movable body 50, and thus, the movable body 50 is pulled toward the substrate 10. As the movable body 50 is pulled toward the substrate 10, there is a concern that the movable body 50 comes into contact with the protruding section 14.

For example, if the protruding section 14 comes into contact with the movable body 50 during the anode bonding of the substrate 10 and the cover 60, an unintended anode bonding occurs between the protruding section 14 including the borosilicate glass and the movable body 50 including the silicon.

For this reason, the protruding section 14 of the sensor element 1d is covered by the detection electrode section 21, and thus, it is possible to suppress the movement of the Na ions generated in the anode bonding, and to suppress the occurrence of the anode bonding even though the movable body 50 comes into contact with the protruding section 14. Further, when the protruding section 14 comes into contact with the detection electrode section 21 that covers the protruding section 14 as the movable body 50 is inclined, since there is a concern that the loss of the electrostatic capacitance generated between the movable body 50 and the detection electrode section 21 occurs, the insulating section 32 is provided to cover the detection electrode section 21 provided on the protruding section 14.

For example, as shown in FIG. 7B, the insulating section 32 may be provided at least at a portion where the protruding section 14 comes into contact with the movable body 50.

According to the above-described fifth embodiment, it is possible to achieve the following effects.

According to the sensor element 1d, the detection electrode section 21 is provided to cover the first protruding section 14a and the second protruding section 14b (the protruding section 14), and the insulating section 32 that covers the detection electrode section 21 is provided at the portion of the protruding section 14 that comes into contact with the movable body 50.

Accordingly, in the sensor element 1d, when the protruding section 14 is formed as an insulating body, it is possible to block the electric field due to the charging by the detection electrode section 21, and to suppress the movable body 50 from being electrostatically pulled toward the protruding section 14. Further, in manufacturing the sensor element 1d, even though the movable body 50 comes into contact with the protruding section 14, the movement of the Na ions is suppressed by the detection electrode section 21 provided on the protruding section 14, and thus, it is possible to suppress the movable body 50 and the protruding section 14 from being anode-bonded. Accordingly, it is possible to obtain the sensor element 1d in which the electrostatic pull of the movable body 50 toward the protruding section 14 is suppressed and an unintended bonding of the movable body 50 and the protruding section 14 is suppressed.

As the most preferable configuration in the above-described embodiments, a configuration in which the plural protruding sections 14 are provided is shown, but a configuration in which one protruding section 14 is provided may be used.

For example, in the sensor elements 1, 1a to 1d, in an initial state where acceleration or the like is not applied, the movable body 50 is inclined toward the second detection electrode section 21b. Here, if the acceleration is applied, the movable body 50 is inclined toward the first detection electrode section 21a, and if the acceleration is further applied, the first protruding section 14a and the movable body 50 may be in contact with each other.

Accordingly, if at least one protruding section 14 is provided, it is possible to achieve the above-described effects.

Further, for example, in a sensor element having a structure in which a movable body is displaced in a vertical direction in parallel with a detection electrode section (for example, JP-A-11-101697), the protruding section that protrudes from the region where the detection electrode section is provided toward the movable body, according to the invention, may be provided.

In such a sensor element, by providing at least one protruding section having a protrusion size larger than the size of the thickness of the detection electrode section in a direction where the movable body is displaced, it is possible to prevent contact of the movable body and the detection electrode section. Accordingly, it is possible to suppress the contact of the movable body and the detection electrode section and a short circuit due to the contact, and to suppress the loss of the electrostatic capacitance generated between the movable body and the detection electrode section.

Accordingly, it is possible to obtain a sensor element capable of suppressing contact of the movable body and the detection electrode section, and continuously detecting acceleration or the like even when excessive acceleration or the like is applied.

Examples

Examples to which any one of the sensor element 1 and the sensor elements 1a to 1d (hereinafter, collectively referred to as the sensor element 1) according to the embodiments of the invention are applied will be described with reference to FIGS. 8 to 11.

Electronic Apparatuses

Electronic apparatuses to which the sensor element 1 according to the embodiment of the invention is applied will be described with reference to FIGS. 8 to 10.

Figure 8:
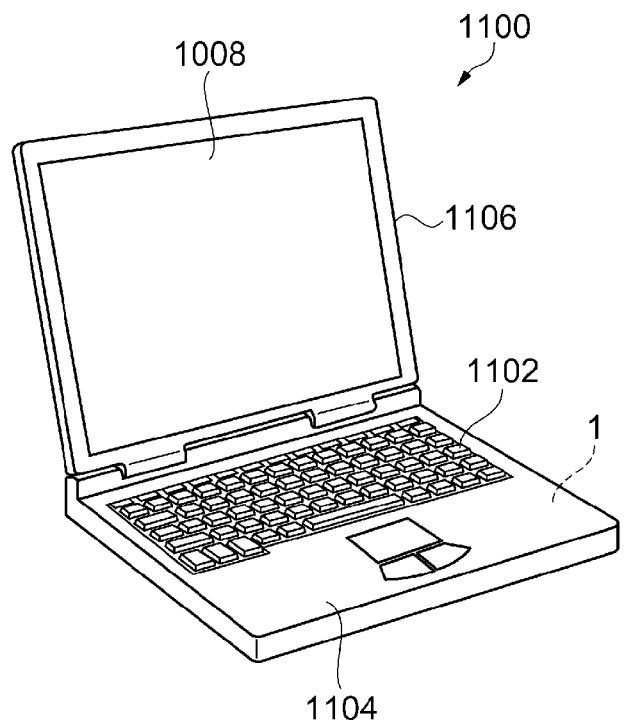
FIG. 8 is a diagram schematically illustrating a personal computer that is an electronic apparatus according to an example.

FIG. 8 is a perspective view illustrating a configuration of a laptop type (or mobile) personal computer to which the vibration element according to the embodiment of the invention is applied. In FIG. 8, a laptop type personal computer 1100 includes a main body section 1104 provided with a keyboard 1102, and a display unit 1106 provided with a display section 1008. The display unit 1106 is supported to the main body section 1104 to be rotatable through a hinge structure section. A electrostatic capacitance type sensor element 1 that functions as an acceleration sensor or the like for detecting acceleration or the like applied to the laptop type personal computer 1100 and displaying the acceleration or the like in the display unit 1106 is built in the laptop type personal computer 1100. Since the loss of the electrostatic capacitances C1 and C2 is suppressed as the movable body 50 comes into contact with the substrate 10, the sensor element 1 can continuously measure acceleration or the like. Accordingly, it is possible to obtain the laptop type personal computer 1100 with high reliability.

Figure 9:
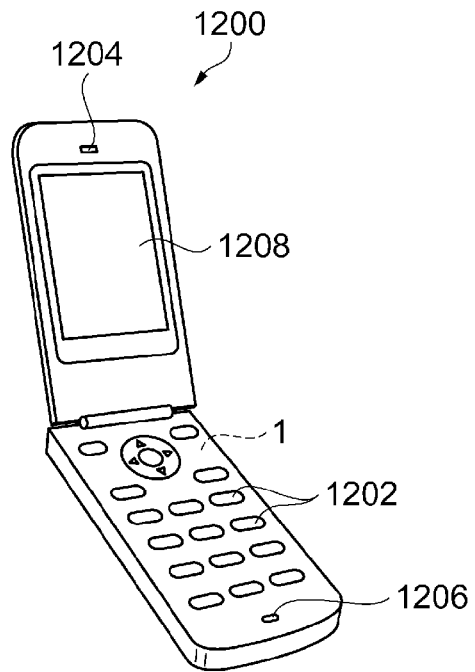
FIG. 9 is a diagram schematically illustrating a mobile phone that is an electronic apparatus according to an example.

FIG. 9 is a perspective view schematically illustrating a configuration of a mobile phone (including a PHS) as an electronic apparatus that includes a vibrator according to an embodiment of the invention. In FIG. 9, a mobile phone 1200 includes plural operation buttons 1202, an ear piece 1204 and a mouthpiece 1206, and a display section 1208 is disposed between the operation buttons 1202 and the ear piece 1204. The electrostatic capacitance type sensor element 1 that functions as an accelerator sensor or the like for detecting acceleration or the like applied to the mobile phone 1200 to support an operation of the mobile phone 1200 is built in the mobile phone 1200. Since the loss of the electrostatic capacitances C1 and C2 is suppressed as the movable body 50 comes into contact with the substrate 10, the sensor element 1 can continuously measure acceleration or the like. Accordingly, it is possible to obtain the mobile phone 1200 with high reliability.

Figure 10:
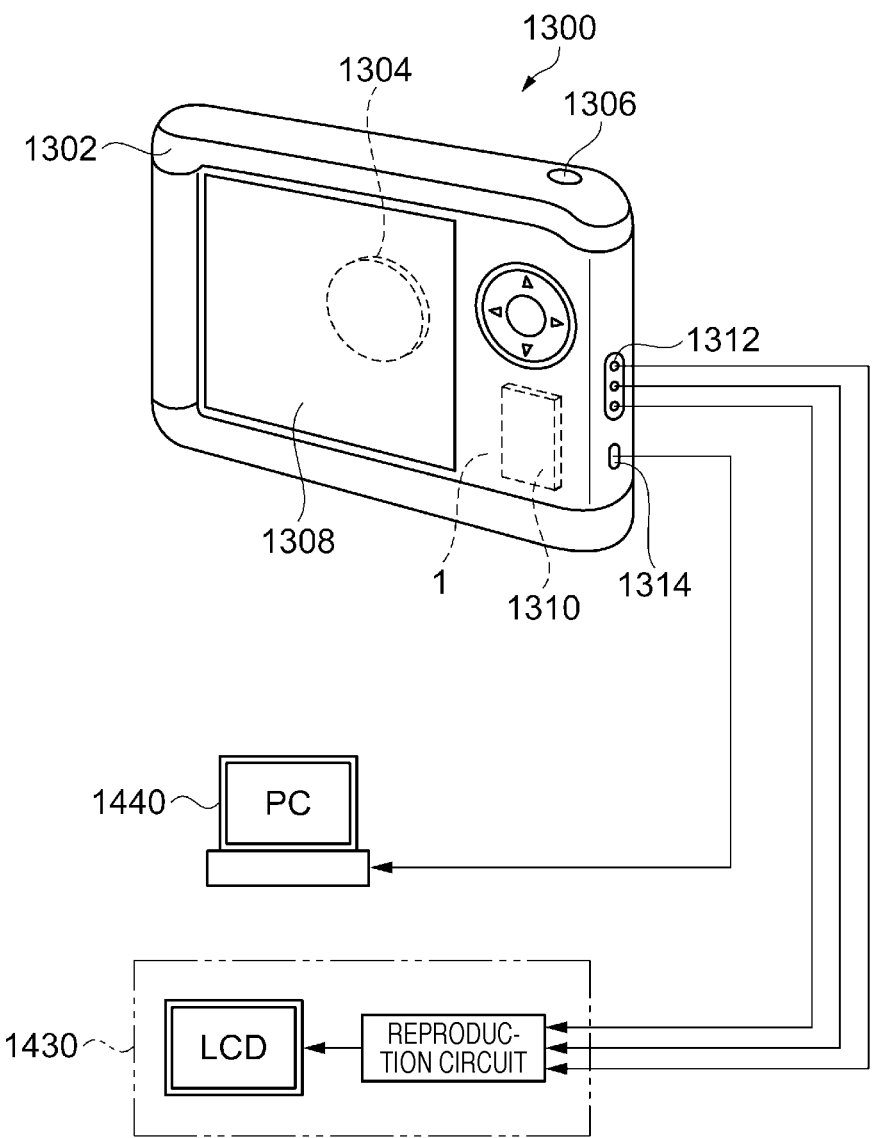
FIG. 10 is a diagram schematically illustrating a digital still camera that is an electronic apparatus according to an example.

FIG. 10 is a perspective view illustrating a configuration of a digital still camera to which the electronic apparatus that includes the vibrator according to the embodiment of the invention is applied. In FIG. 10, connection to an external device is also simply shown. Here, an ordinary camera has a configuration in which a silver salt photo film is exposed to a light image of an object, whereas a digital still camera 1300 has a configuration in which a light image of an object is photoelectrically converted by an imaging element such as a charge-coupled device (CCD) to generate an imaging signal (image signal).

A display section 1308 is provided on a rear surface of a case (body) 1302 in the digital still camera 1300 to perform display based on the imaging signal obtained by the CCD. The display section 1308 functions as a finder that displays the object as an electronic image. Further, a light receiving unit 1304 that includes an optical lens (imaging optical system), a CCD or the like is provided on a front surface side (rear surface side in the figure) of the case 1302.

If a user checks an object image displayed in the display section 1308 and presses a shutter button 1306, an imaging signal of the CCD at that time is transmitted to and stored in a memory 1310. Further, in the digital still camera 1300, a video signal output terminal 1312 and a data communication input/output terminal 1314 are provided on a side surface of the case 1302. Further, as shown in FIG. 10, a liquid crystal display 1430 is connected to the video signal output terminal 1312, and a personal computer 1440 is connected to the data communication input/output terminal 1314, as necessary. Further, the imaging signal stored the memory 1310 is output to the liquid crystal display 1430 or the personal computer 1440 by a predetermined operation. The electrostatic capacitance type sensor element 1 that functions as an acceleration sensor that detects acceleration due to dropping to operate a protection function of the digital still camera 1300 against the dropping is built in the digital still camera 1300. Since the loss of the electrostatic capacitances C1 and C2 is suppressed as the movable body 50 comes into contact with the substrate 10, such a sensor element 1 can continuously measure acceleration or the like. Accordingly, it is possible to obtain the digital still camera 1300 with high reliability.

The sensor element 1 according to the embodiment of the invention may be applied to an electronic apparatus such as an ink jet discharge apparatus (for example, an ink jet printer), a television, a video camera, a video tape recorder, a car navigation device, a pager, an electronic organizer (including a communication function), an electronic dictionary, a calculator, an electronic game machine, a word processor, a work station, a video phone, a security TV monitor, electronic binoculars, a POS terminal, a medical device (for example, an electronic thermometer, a blood manometer, a blood sugar level meter, an electrocardiographic measuring device, an ultrasonic diagnostic device or an electronic endoscope), a fish-finder, a variety of measuring devices, a meter (for example, a meter for a vehicle, an airplane or a ship), a flight simulator or the like, for example, in addition to the laptop type personal computer (mobile personal computer) shown in FIG. 8, the mobile phone shown in FIG. 9 and the digital still camera shown in FIG. 10.

Moving Object

Figure 11:
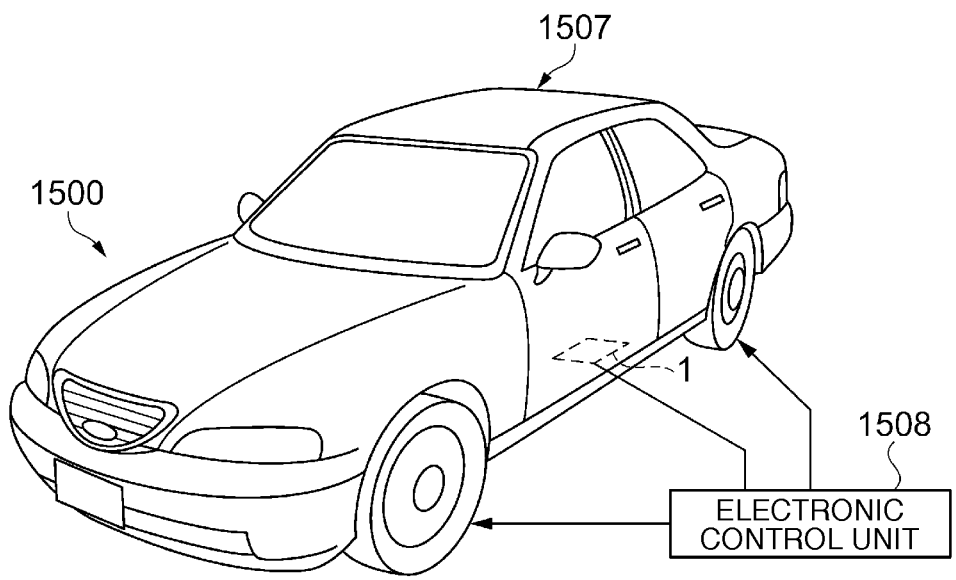
FIG. 11 is a diagram schematically illustrating an automobile that is a moving object according to an example.

FIG. 11 is a perspective view schematically illustrating an automobile that is an example of a moving object. An automobile 1500 is configured so that the sensor element 1 that functions as an acceleration sensor is mounted in a variety of control units. For example, as shown in FIG. 11, in the automobile 1500 that is the moving object, an electronic control unit (ECU) 1508 that is provided therein with the sensor element 1 that detects acceleration of the automobile 1500 to control an output of an engine is mounted in a vehicle body 1507. By detecting the acceleration and controlling the engine to have an appropriate output according to the posture of the vehicle body 1507, it is possible to obtain the automobile 1500 that is an efficient moving object in which consumption of fuel or the like is suppressed.

In addition, the sensor element 1 may be widely applied to a vehicle body posture control unit, an anti-lock braking system (ABS), an air bag or a tire pressure monitoring system (TPMS).

According to the sensor element 1 having such a configuration, since the loss of the electrostatic capacitances C1 and C2 is suppressed as the movable body 50 comes into contact with the substrate 10, it is possible to continuously measure acceleration or the like. Accordingly, it is possible to obtain the moving object 1500 with high reliability.

The entire disclosure of Japanese Patent Application No. 2013-103789, filed May 16, 2013 is expressly incorporated by reference herein.

What is claimed is:

1. A sensor element comprising:
    a substrate that has a first protrusion protruding upwardly from an upper surface of the substrate:
    a first detection electrode that is formed on the upper surface of the substrate and a top surface of the first protrusion, the first detection electrode providing first information for detecting a physical quantity detected by the sensor element;
    a first insulating member that is formed on the first detection electrode which is located on the to surface of the first protrusion so that the first insulating member and the first detection electrode are stacked on the to surface of the first protrusion; and
    a movable body that moves with respect to a moving axis and that is provided to face the first detection electrode so that the movable body is spaced apart form the first insulating member via a first air gap, the first air gap being chanced when the movable body moves.

2. The sensor element according to claim 1, further comprising:
    a second protrusion that protrudes upwardly from the upper surface of the substrate;
    a second protrusion electrode that is formed on the upper surface of the substrate and a top surface of the second protrusion, the second detection electrode providing second information for detecting the physical quantity detected by the sensor element; and
    a second insulating member that is formed on the second detection electrode which is located on the top surface of the second protrusion so that the second insulating member and the second detection electrode are stacked on the to surface of the second protrusion, wherein
    the movable body faces the second detection electrode so that the movable body is spaced apart from the second insulating member via a second air gap, and the second air gap is changed when the movable body moves, and
    the first detection electrode is electrically insulated from the second detection electrode.

3. The sensor element according to claim 2,
    wherein the second protrusion is provided integrally with the substrate.

4. The sensor element according to claim 2, further comprising:
    a second dummy electrode that is formed on the upper surface of the substrate so as to face the movable body in at least a part thereof, the second dummy electrode being electrically insulated from the second detection electrode.

5. The sensor element according to claim 4,
    wherein a groove is provided in the bottom of the recess, the groove is provided in one of a region between the second detection electrode and the second dummy electrode and a region between the first detection electrode and the second detection electrode.

6. The sensor element according to claim 4,
    wherein the first and second dummy electrodes are electrically connected to the movable body.

7. The sensor element according to claim 1,
    wherein the first protrusion is provided integrally with the substrate.

8. The sensor element according to claim 1, further comprising:
    a first dummy electrode that is formed on the upper surface of the substrate so as to face the movable body in at least a part thereof, the first dummy electrode being electrically insulated from the first detection electrode.

9. A sensor element comprising:
    a substrate that has a recess and a peripheral ledge;
    a lid that has a lid peripheral, the lid peripheral being fixed to the peripheral ledge so as to create an inner space;
    a movable body that is provided in the inner space, the movable body having first and second members continuously formed via a rotation axis, and the first and second members rotate with respect to the rotation axis;
    a first detection electrode that is formed on a bottom of the recess so as to face the first member via a first air gap;
    a second detection electrode that is formed on the bottom of the recess so as to face the second member via a second air gap;
    a first protruding member that is formed on the bottom of the recess so as to face the first member via a third air gap, the first protruding member being surrounded by the first detection electrode in a plan view;
    a second protruding member that is formed on the bottom of the recess so as to face the second member via a fourth air gap, the second protruding member being surrounded by the second detection electrode in the plan view;
    a first dummy electrode that is provided on the bottom of the recess between the peripheral ledge and an edge of the first detection electrode, the first dummy electrode being laterally shifted from the first detection electrode and the first member in the plan view;
    a second dummy electrode that is provided on the bottom of the recess between the peripheral ledge and an edge of the second detection electrode, the second dummy electrode being laterally shifted from the second detection electrode in the plan view, the second dummy electrode being overlapped with the second member in the plan view, wherein
    the first and second air gaps are the same size, and
    the first and second dummy electrodes and the lid have a same electric potential.

10. The sensor element according to claim 9,
    wherein an insulating material is provided on top surfaces of the first and second protruding members, and the insulating material comes into contact with the movable body.

11. The sensor element according to claim 9,
    wherein a groove is provided in the bottom of the recess, the groove is provided in one of a region between the second detection electrode and the second dummy electrode and a region between the first detection electrode and the second detection electrode.

12. The sensor element according to claim 11, further comprising:
   a third protruding member that is provided on the bottom of the recess, that protrudes toward the movable body in the vicinity of the rotation axis, and that is provided along an outer edge of the groove.

13. The sensor element according to claim 11,
   wherein the first and second dummy electrodes are electrically connected to the movable body.

14. The sensor element according to claim 9,
   wherein the first and seconddummy electrodes are electrically connected to the movable body.

15. An electronic apparatus comprising the sensor element according to claim 9 that is mounted therein.

16. A moving object comprising the sensor element according to claim 9 that is mounted therein.

* * * * *